(12) United States Patent
Genevaux et al.

(10) Patent No.: US 7,057,955 B2
(45) Date of Patent: Jun. 6, 2006

(54) DYNAMICALLY UNBALANCED SENSE AMPLIFIER

(75) Inventors: Franck Genevaux, Revel (FR); Francois Jacquet, Froges (FR)

(73) Assignee: STMicroelectronics S.A., Montrouge (FR)

( * ) Notice: Subject to any disclaimer, the term of this patent is extended or adjusted under 35 U.S.C. 154(b) by 84 days.

(21) Appl. No.: 10/860,080

(22) Filed: Jun. 3, 2004

(65) Prior Publication Data

US 2004/0246800 A1  Dec. 9, 2004

(30) Foreign Application Priority Data

Jun. 4, 2003 (FR) .................................. 03 06751

(51) Int. Cl.
  *G11C 7/00* (2006.01)
(52) U.S. Cl. ................... 365/205; 365/63; 365/202
(58) Field of Classification Search ................ 365/205, 365/207, 202, 63, 189.05, 189.09, 185.21; 327/51, 53, 55
See application file for complete search history.

(56) References Cited

U.S. PATENT DOCUMENTS

| | | | |
|---|---|---|---|
| 4,630,240 A | 12/1986 | Poteet et al. ................ 365/189 |
| 5,280,205 A * | 1/1994 | Green et al. .................. 327/51 |
| 5,544,110 A | 8/1996 | Yuh ............................ 365/205 |
| 6,424,181 B1 * | 7/2002 | Pogrebnoy .................... 327/55 |
| 6,914,836 B1 * | 7/2005 | Jeon et al. ................... 365/205 |
| 2002/0180589 A1 | 12/2002 | Gabara ..................... 340/146.2 |

OTHER PUBLICATIONS

Esp@cenet database, Patent Abstract of JP 10-055672, Feb. 24, 1998.

* cited by examiner

*Primary Examiner*—Gene N. Auduong
(74) *Attorney, Agent, or Firm*—Lisa K. Jorgenson; Robert Iannucci; Seed IP Law Group PLLC

(57) ABSTRACT

A sense amplifier connected to first and second bit lines, comprising means for precharging said bit lines to a high voltage, means for connecting one or the other of the bit lines to a memory cell, said connection causing according to the state of the memory cell a maintaining of the bit line at the high voltage or a voltage reduction, first and second transistors respectively controlled by the first and second bit lines, and, in series with the first and second transistors, a controllable means for the current through the transistor controlled by the bit line connected to the memory cell to be greater than the current through the other transistor when the voltages of the two bit lines are at the high voltage.

19 Claims, 2 Drawing Sheets

DYNAMICALLY UNBALANCED SENSE AMPLIFIER

BACKGROUND OF THE INVENTION

1. Field of the Invention

The present invention relates to the reading from memory circuits, and in particular to sense amplifiers.

2. Discussion of the Related Art

In a memory circuit array such as DRAM, each memory cell comprises a capacitor that can be electrically isolated by a switch. The capacitor of each cell is at a high supply voltage Vdd or at a low voltage, for example zero, according to whether the memory cell stores a "1" or a "0". To read the information stored in a memory cell, the cell capacitor is connected to a bit line connected to a memory cell column, and a sense amplifier is used to detect the bit line voltage.

FIG. 1 schematically shows a sense amplifier connected to a bit line BL likely to be connected by a switch SW to a memory cell M symbolized by a capacitor C. A single memory cell M is shown although, in practice, several memory cells are likely to be connected to bit line BL. The sense amplifier comprises an N-channel transistor T0 having its gate connected to bit line BL and having its drain connected to a reference bit line BLref having the same electric characteristics as bit line BL. An N-channel transistor T1 has its gate connected to line BLref and its drain connected to line BL. A P-channel transistor T2 has its gate connected to the drain of transistor T1, its drain connected to the drain of transistor T0, and its source connected to a supply voltage Vdd. A P-channel transistor T3 has its gate connected to the drain of transistor T0, its drain connected to the drain of transistor T1, and its source connected to voltage Vdd. The sources of transistors T0 and T1 are connected to the drain of an N-type transistor T4. The source of transistor T4 is grounded and its gate receives a signal Sense for activating the sense amplifier. Precharge blocks Pr, activable by signals not shown, are connected to lines BL and BLref.

Lines BL and BLref are conventionally precharged to a reference voltage by blocks Pr before reading of the information stored in the memory cell. The particularly simple case where the reference voltage is the high circuit supply voltage (Vdd) is here considered. Once the precharge is over, lines BL and BLref are isolated. To read the content of a cell, switch SW is turned on. If cell M stores voltage Vdd (state "1"), the voltage of line BL is not modified. However, if cell M stores the zero voltage (state "0"), line BL discharges into capacitor C to reach an equilibrium voltage Vdd-δV ranging between Vdd and 0V. A predetermined time period after the closing of switch SW, signal Sense is activated to turn on transistor T4.

If bit line BL is at voltage Vdd-δV when transistor T4 is on, transistor T0 is controlled by a voltage Vdd-δV and transistor T1 is controlled by voltage Vdd. Bit line BL then discharges to ground through transistor T1 faster than bit line BLref discharges to ground through transistor T0. The voltage of line BL decreases faster than the voltage of line BLref, which turns on transistor T2 before transistor T3. This forces lines BLref to voltage Vdd, forces transistors T1 and T3 respectively to the on and off states, and forces line BL to ground. The state of line BL can then be read by a digital means not shown, and the reading of state "0" from cell M is ended. The bit lines may again be precharged to read the information stored in another memory cell, not shown.

If bit line BL is at voltage Vdd when transistor T4 is on (the memory point stores a 1), transistors T0 and T1 are controlled by the same voltage Vdd. The dimensions of transistors T0 and T1 must be different for transistor T0 to conduct a greater current than the current flowing through transistor T1. The voltage of line BLref thus decreases faster than the voltage of line BL, which turns on transistor T3 before transistor T2. The turning-on of transistor T3 forces line BL to voltage Vdd, which provides a digital value "1" to a read means not shown, and forces transistors T0 and T2 respectively to the on and off states. The operation of reading state "1" from cell M is then over. It should be noted that if transistors T0 and T1 were identical, one or the other of lines BL or BLref would switch to ground at the end of the reading of a "1", in undetermined fashion. The reading of a "1" could then not be surely differentiated from the reading of a "0".

The use of the reference bit line, to which usable memory cells cannot be connected, reduces the integration density of a memory circuit comprising sense amplifiers such as in FIG. 1.

Structures with symmetrical sense amplifiers connected to two functional bit lines enabling indifferent reading from a memory cell connected to one or the other of the bit lines are known. Such amplifiers enable reading from twice as many memory cells as the amplifier of FIG. 1, but they only operate if the bit lines are precharged to an intermediary voltage (for example, Vdd/2) between supply voltage Vdd and the ground. The generation of voltage Vdd/2 poses many problems, especially consumption and stability problems.

SUMMARY OF THE INVENTION

An object of the present invention is to provide a sense amplifier connected to two functional bit lines without requiring use of an intermediary precharge voltage.

To achieve this object, as well as others, the present invention provides a sense amplifier connected to first and second bit lines, comprising means for precharging said bit lines to a high voltage, means for connecting one or the other of the bit lines to a memory cell, said connection causing according to the state of the memory cell a maintaining of the bit line at the high voltage or a voltage reduction, and first and second transistors respectively controlled by the first and second bit lines, and further comprising in series with the first and second transistors a controllable means for the current flowing through the transistor controlled by the bit line connected to the memory cell to be greater than the current flowing through the other transistor when the voltages of the two bit lines are at the high voltage.

According to an embodiment of the present invention, the first and second transistors are identical MOS transistors of a first conductivity type and the controllable means comprises third and fourth transistors having their drain terminals connected to the source terminal of the first transistor, and fifth and sixth transistors having their drain terminals connected to the source terminal of the second transistor, the third and fifth transistors being of same dimensions and receiving on their gate terminal a signal for activating the sense amplifier, the fourth and sixth transistors being of same dimensions and respectively receiving on their gate terminal control signals for the reading from the first and second bit lines.

The present invention also aims at a memory circuit comprising a plurality of memory cells connectable to a plurality of such sense amplifiers.

According to an embodiment of the present invention, the first and second transistors are identical MOS transistors of a first conductivity type and the controllable means comprises seventh and eighth transistors having their drain terminals connected to the source terminal of the first transistor, and ninth and tenth transistors having their drain terminals connected to the source terminal of the second transistor, the eighth and tenth transistors being of same dimensions, the seventh and ninth transistors being of same dimensions and selected to be, when on, more conductive than the eighth and tenth transistors, the seventh and tenth transistors receiving on their gate terminal a control signal for reading from the first bit line and the eighth and ninth transistors receiving on their gate terminal a control signal for reading from the second bit line.

According to an embodiment of the present invention, the sense amplifier further comprises an eleventh transistor arranged between the source terminal of the first transistor and the drain terminals of the seventh and eighth transistors, and a twelfth transistor arranged between the source terminal of the second transistor and the drain terminals of the ninth and tenth transistors, the eleventh and twelfth transistors receiving on their gate terminal a signal for activating the sense amplifier.

The present invention also aims at a memory circuit comprising a plurality of memory cells connectable to a plurality of such sense amplifiers, in which the first and second transistors of each sense amplifier are connected to single seventh, eighth, ninth, and tenth transistors.

According to an embodiment of the present invention, the drain terminals of the first and second transistors are respectively connected to the second and first lines and the gate terminals of the first and second transistors are respectively connected to the first and second bit lines, and the amplifier comprises thirteenth and fourteenth MOS transistors of a second conductivity type having their source terminals connected to a supply voltage, having their drain terminals respectively connected to the drain terminals of the first and second transistors and having their gate terminals respectively connected to the drains of the second and first transistors.

The foregoing object, features, and advantages of the present invention will be discussed in detail in the following non-limiting description of specific embodiments in connection with the accompanying drawings.

DETAILED DESCRIPTION

Only those elements necessary to the understanding of the present invention have been shown.

Figure 1:
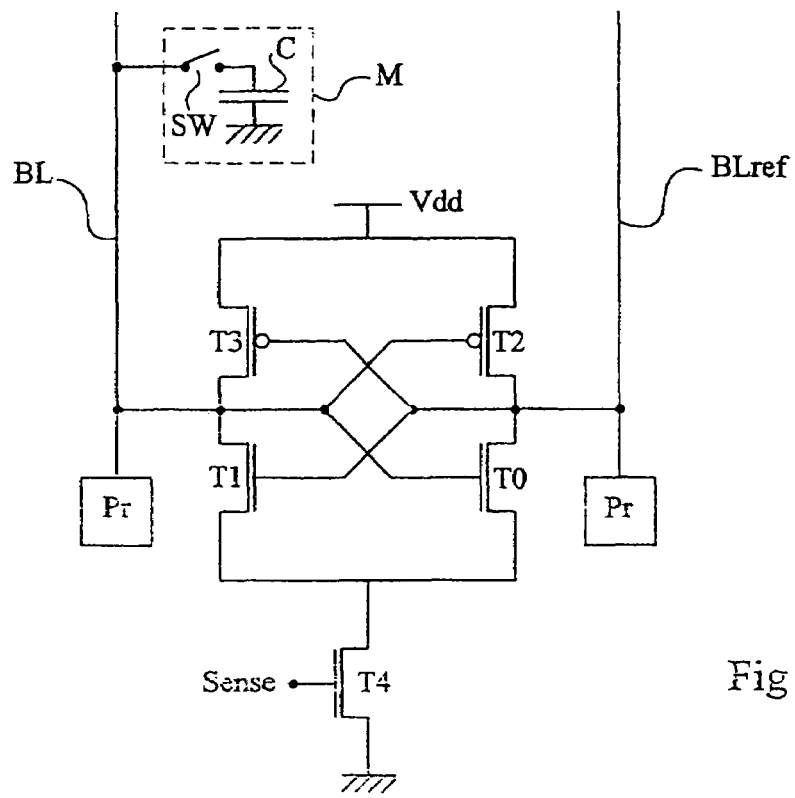
FIG. 1, previously described, shows a conventional sense amplifier.
Figure 2:
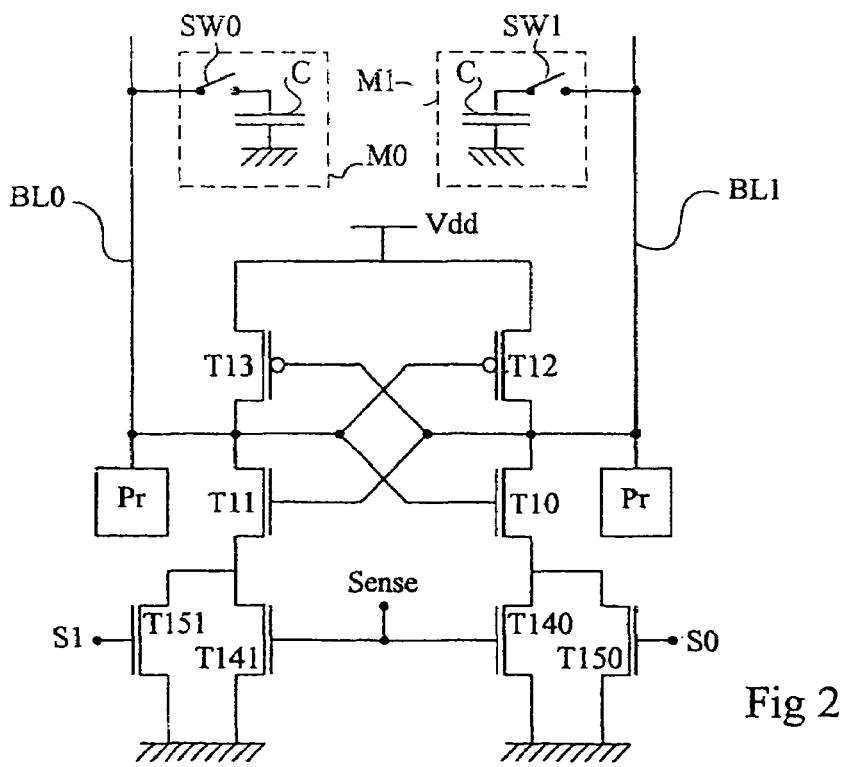
FIG. 2 shows a first embodiment of a sense amplifier according to the present invention.

FIG. 2 schematically shows a sense amplifier according to an embodiment of the present invention, connected to two bit lines of same dimensions, BL0 and BL1, each of which is likely to be connected by a switch SW0, SW1 to the capacitor C of a memory cell, M0, M1, from among the memory cells, not shown, connected to bit lines BL0, BL1. A precharge block Pr is connected to each bit line. An N-channel transistor T10 has its gate connected to line BL0 and its drain connected to line BL1. An N-channel transistor T11 has its gate connected to line BL1 and its drain to line BL0. A P-channel transistor T12 has its gate connected to the drain of transistor T11, its drain connected to the drain of transistor T10, and its source connected to a supply voltage Vdd. A P-channel transistor T13 has its gate connected to the drain of transistor T10, its drain connected to the drain of transistor T11, and its source connected to voltage Vdd. Two N-channel transistors T140, T150 have their drain connected to the source of transistor T10 and their source connected to ground, and two N-channel transistors T141, T151 have their drain connected to the source of transistor T11 and their source connected to ground. Transistors T140, T141, of same dimensions, receive on their gate a signal Sense such as in FIG. 1. According to the present invention, transistors T150, T151, of same dimensions, respectively receive on their gates signals S0, S1 respectively activated when line BL0 or BL1 is desired to be read from.

The reading of information stored in a memory cell is preceded with a precharge of lines BL0 and BL1 to voltage Vdd by blocks Pr. Switch SW0 or SW1 is on according to whether the information stored in memory cell M0 or that in cell M1 is desired to be read. It is considered hereafter as an example that memory cell M0 is read from. The voltage of line BL0 remains at Vdd or falls to a voltage Vdd-δV according to whether cell M0 is in a state "1" or "0" when switch SW0 is on. Signals Sense and S0 are then activated to turn on transistors T140, T141 and T150. Upon reading from line BL0, no memory point is activated on line BL1 which thus remains at the precharge voltage (Vdd in this example).

In the case where bit line BL0 is at voltage Vdd-δV when transistors T140, T141, and T150 are on, transistor T10 is controlled by a voltage Vdd-δV smaller than voltage Vdd controlling transistor T11. The voltage of line BL0 decreases faster than the voltage of line BL1, which turns on transistor T12 before transistor T13 and forces line BL1 to voltage Vdd and line BL0 to ground.

In the case where bit line BL0 is at voltage Vdd when transistors T140, T141, and T150 are on, transistors T10 and T11 are controlled by the same voltage Vdd. According to the present invention, however, the current flowing through transistor T10 in series with transistors T140 and T150 is stronger than the current flowing through transistor T11 in series with the sole transistor T141. The voltage of line BL1 thus decreases faster than the voltage of line BL0, which turns on transistor T13 before transistor T12 and forces line BL0 to voltage Vdd.

The sense amplifier according to the present invention operates symmetrically for the reading from memory cell M1. The activation of the sense amplifier will then be performed by signals Sense and S1, and not Sense and S0, to turn on transistors T140, T141, and T151. The respective dimensions of transistors T140, T141, and T150, T151 are selected according to the characteristics of the sense amplifier. In practice, transistors T140, T141, T150, and T151 may be of same dimensions.

A sense amplifier according to the present invention thus enables reading from a memory cell indifferently connected to one or the other of two bit lines precharged to the supply voltage, and enables reading from twice as many memory cells as the amplifier of FIG. 1 without having to use an intermediary precharge voltage.

Figure 3:
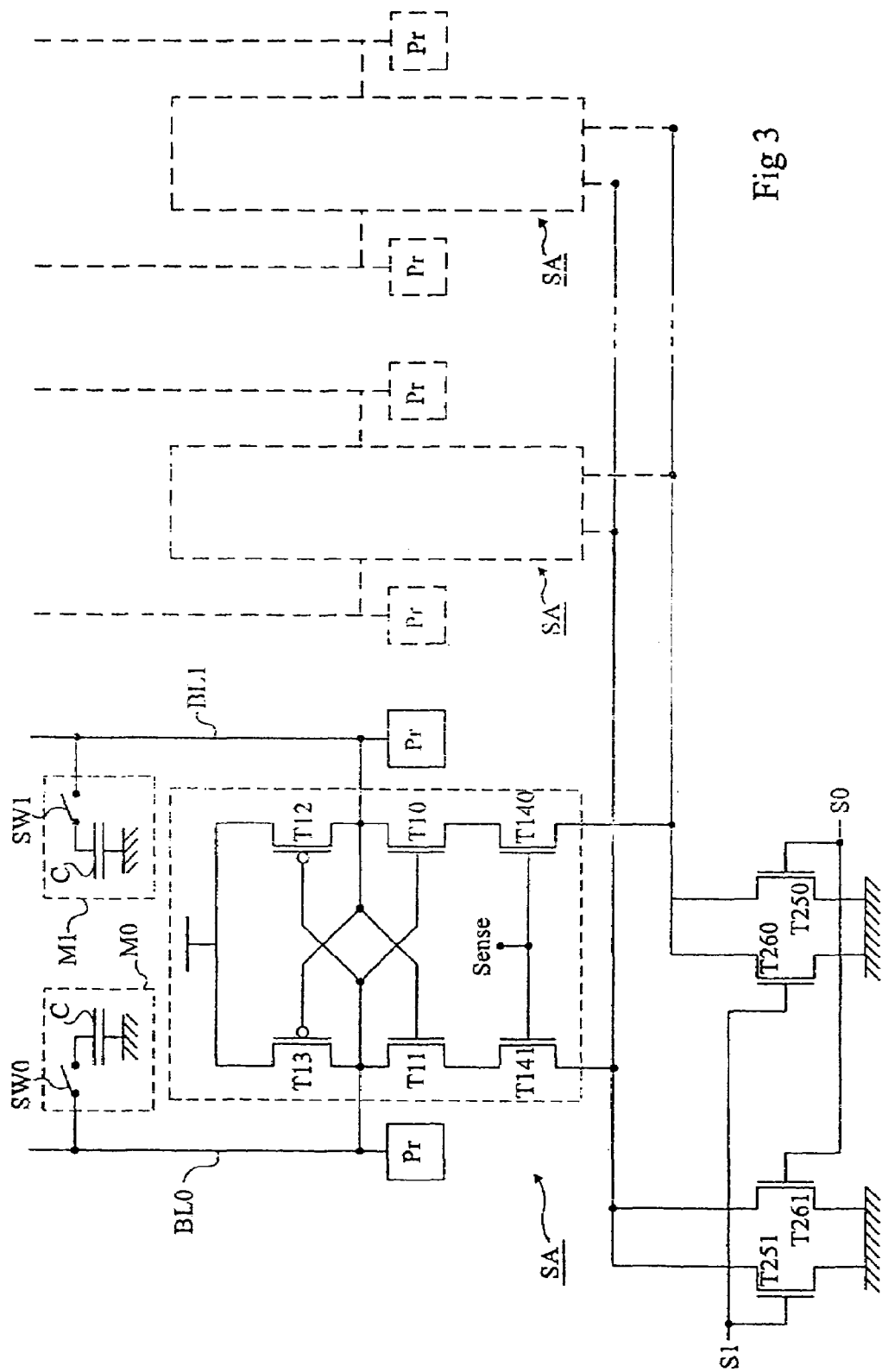
FIG. 3 shows a second embodiment of a sense amplifier according to the present invention.

FIG. 3 schematically shows a sense amplifier (SA) according to another embodiment of the present invention. Same references represent same elements in FIGS. 2 and 3. The sense amplifier is connected to two bit lines BL0, BL1, each of which is likely to be connected by a switch SW0, SW1 to the capacitor C of a memory cell M0, M1. Precharge blocks Pr are connected to lines BL0 and BL1. The structure of the sense amplifier is the same as in FIG. 2 as concerns transistors T10, T11, T12, and T13. The gates and drains of transistors T140 and T141 are connected as in FIG. 2.

Two N-channel transistors T250, T260 have their drain connected to the source of transistor T140 and their source connected to ground, and two N-channel transistors T251, T261 have their drain connected to the source of transistor T141 and their source connected to ground. Transistors T260, T261 are equal. Transistors T250 and T251 are equal and selected to be, when on, more conductive than on transistors T260, T261. As an example, transistors T250 and T251 may have a gate of same length and of twice as small a width as transistors T260 and T261. Transistors T251, T260 are controlled by signal S1 and transistors T250, T261 are controlled by signal S0.

Advantageously, transistors T250, T251, T260, T261 may be connected to the sources of transistors T140, T141 of several sense amplifiers, as shown in dotted lines. According to such an embodiment, each sense amplifier can receive a specific signal Sense activable to select the pair of bit lines connected to the amplifier, and signals S0 and S1 are activated to control the reading either from the first, or from the second bit lines belonging to the selected bit line pairs. Such an embodiment especially enables using a reduced number of transistors, and thereby taking up a reduced chip surface area.

The sense amplifier operation is substantially the same as in FIG. 2. Considering a reading from memory cell M0, the voltage of line BL0 is, after turning-on of switch SW0, at Vdd or at Vdd-δV according to whether cell M0 was in a state "1" or "0". Signals Sense and S0 are then activated to turn on transistors T140, T141, T250, and T261 (preferably, S0 will be activated before the signal Sense which will start the reading, then will remain unchanged until the next precharge).

In the case where bit line BL0 is at voltage Vdd-δV when transistors T140, T141, T250, and T261 are on, the sense amplifier forces line BL1 to voltage Vdd and line BL0 to ground in the same way as the sense amplifier of FIG. 2.

In the case where bit line BL is at voltage Vdd when transistors T140, T141, T250, and T261 are on, the current flowing through transistors T11, T141, and T261 is smaller than the current flowing through transistors T10, T140, and T250, due to the selection of transistors T261 and T250, which turns on transistor T13 before transistor T12 and forces line BL0 to voltage Vdd.

The sense amplifier operation is symmetrical for the reading from memory cell M1.

Of course, the present invention is likely to have various alterations, modifications, and improvements which will readily occur to those skilled in the art. In particular, transistors T140 and T141 of the sense amplifier of FIG. 3 may be suppressed. Such an alternative, taking up a small surface area, is appropriate for a memory circuit in which a memory cell in all the first or all the second bit lines connected to the sense amplifiers connected to the same transistors T250, T251, T260, T261 is simultaneously desired to be read from.

Also according to an alternative, each of transistors T250, T251 may be replaced with two transistors having the dimensions of transistors T260, T261. Thus, the imbalance will be created by the turning on on one side of two identical transistors and on the other side of a single transistor identical to the other two.

The present invention has been described in relation with a specific sense amplifier structure, but it will easily apply to other structures. Especially, the drains of transistors T10 and T11 may be connected not to the bit lines but to digital read means.

Further, a specific DRAM cell structure has been described, but the present invention is likely to be adapted to the reading from any memory cell, of DRAM type or of another type. In particular, the present invention may be used to read ROM- or SRAM-type memory cells.

The present invention has been described in relation with a positive supply voltage Vdd and MOS transistors having specific conductivity types, but those skilled in the art will readily adapt the present invention to a negative supply voltage, using transistors of appropriate conductivity types.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A sense amplifier connected to first and second bit lines, comprising:
    means for precharging said bit lines to a high voltage;
    means for connecting one or the other of the bit lines to a memory cell, said connection causing according to the state of the memory cell a maintaining of the bit line at the high voltage or a voltage reduction;
    first and second transistors respectively controlled by the first and second bit lines; and
    in series with the first and second transistors, a controllable means for the current through the transistor controlled by the bit line connected to the memory cell to be greater than the current through the other transistor when the voltages of the two bit lines are at the high voltage, wherein the first and second transistors are identical MOS transistors of a first conductivity type and wherein the controllable means comprises third and fourth transistors having their drain terminals connected to the source terminal of the first transistor, and fifth and sixth transistors having their drain terminals connected to the source terminal of the second transistor, the third and fifth transistors being of same dimensions and receiving on their gate terminal a signal for activating the sense amplifier, the fourth and sixth transistors being of same dimensions and respectively receiving on their gate terminal control signals for the reading from the first and second bit lines.

2. A sense amplifier connected to first and second bit lines, comprising:
    means for precharging said bit lines to a high voltage;
    means for connecting one or the other of the bit lines to a memory cell, said connection causing according to the state of the memory cell a maintaining of the bit line at the high voltage or a voltage reduction;
    first and second transistors respectively controlled by the first and second bit lines; and
    in series with the first and second transistors, a controllable means for the current through the transistor controlled by the bit line connected to the memory cell to be greater than the current through the other transistor when the voltages of the two bit lines are at the high voltage, wherein the first and second transistors are identical MOS transistors of a first conductivity type and wherein the controllable means comprises third and fourth transistors having their drain terminals connected to the source terminal of the first transistor, and fifth and sixth transistors having their drain terminals connected to the source terminal of the second transistor, the fourth and sixth transistors being of same dimensions, the third and fifth transistors being of same dimensions and selected to be, when on, more conductive than the fourth and sixth transistors, the third and sixth transistors receiving on their gate terminal a control signal for reading from the first bit line and the fourth and fifth transistors receiving on their gate terminal a control signal for reading from the second bit line.

3. The sense amplifier of claim 2, further comprising an seventh transistor arranged between the source terminal of the first transistor and the drain terminals of the third and fourth transistors, and an eighth transistor arranged between the source terminal of the second transistor and the drain terminals of the fifth and sixth transistors, the seventh and eighth transistors receiving on their gate terminal a signal for activating the sense amplifier.

4. The sense amplifier of claim 1, wherein the drain terminals of the first and second transistors are respectively connected to the second and first lines, wherein the gate terminals of the first and second transistors are respectively connected to the first and second bit lines, and comprising thirteenth and fourteenth MOS transistors of a second conductivity type having their source terminals connected to a supply voltage, having their drain terminals respectively connected to the drain terminals of the first and second transistors and having their gate terminals respectively connected to the drains of the second and first transistors.

5. A memory circuit comprising a plurality of memory cells connectable to a plurality of sense amplifiers of claim 1.

6. A memory circuit comprising a plurality of memory cells connectable to a plurality of sense amplifiers of claim 2 wherein the first and second transistors of each sense amplifier are connected to single seventh, eighth, ninth, and tenth transistors.

7. A sense amplifier connected to first and second bit lines, the first and second bit lines selectively connected to first and second memory cells, respectively, the sense amplifier comprising:
first and second precharge circuits respectively connected to the first and second bit lines for precharging the bit lines to a high voltage;
first and second MOS transistors having their gate terminals respectively connected to the first and second bit lines and their drain terminals respectively connected to the second and first bit lines;
third and fourth MOS transistors having their drain terminals connected to the source terminal of the first transistor, the third transistor receiving at its gate terminal a signal for activating a read function, and the fourth transistor receiving at its gate terminal a control signal for reading from the first bit line; and
fifth and sixth MOS transistors having their drain terminals connected to the source terminal of the second transistor, the fifth transistor receiving at its gate terminal the signal for activating a read function, and the sixth transistor receiving at its gate terminal a control signal for reading from the second bit line.

8. The sense amplifier of claim 7 wherein the first and second transistors are identical MOS transistors of a first conductivity type, the third and fifth transistors being of same dimensions, and the fourth and sixth transistors being of same dimensions.

9. The sense amplifier of claim 7 further comprising seventh and eighth MOS transistors of a second conductivity type having their source terminals connected to a supply voltage, having their drain terminals respectively connected to the drain terminals of the first and second transistors, and having their gate terminals respectively connected to the first and second bit lines.

10. The sense amplifier of claim 7 wherein the first and second bit lines are each selectively connected to a plurality of memory cells.

11. A memory circuit comprising:
a first sense amplifier connected to first and second bit lines, the first and second bit lines selectively connected to first and second memory cells, the sense amplifier having: first and second precharge circuits respectively connected to the first and second bit lines for precharging the bit lines to a high voltage; first and second MOS transistors having their gate terminals respectively connected to the first and second bit lines and their drain terminals respectively connected to the second and first bit lines; and third and fourth MOS transistors having their drain terminals respectively connected to the source terminals of the first and second transistors, the third and fourth transistors receiving at their gate terminals a signal for activating a read function; and
a current controller connected to the third and fourth transistors of the first sense amplifier and receiving first and second control signals for reading from the first and second bit lines respectively.

12. The memory circuit of claim 11 wherein the first and second transistors are identical MOS transistors of a first conductivity type, and further comprising fifth and sixth MOS transistors of a second conductivity type having their source terminals connected to a supply voltage, having their drain terminals respectively connected to the drain terminals of the first and second transistors, and having their gate terminals respectively connected to the first and second bit lines.

13. The memory circuit of claim 11 wherein the current controller comprises:
seventh and eighth MOS transistors having their drain terminals connected to the source terminal of the third transistor, the seventh and eighth transistors respectively receiving at their gate terminals the first and second control signals; and
ninth and tenth MOS transistors having their drain terminals connected to the source terminal of the fourth transistor, the ninth and tenth transistors respectively receiving at their gate terminals the second and first control signals.

14. The memory circuit of claim 13 wherein the eighth and tenth transistors are of same dimensions, and the seventh and ninth transistors are of same dimensions and selected to be, when on, more conductive than the eighth and tenth transistors.

15. The memory circuit of claim 11 wherein the first and second bit lines are each selectively connected to a plurality of memory cells.

16. The memory circuit of claim 11 further comprising a second sense amplifier connected to the current controller.

17. A method of reading information stored in a memory cell using a sense amplifier connected to first and second bit lines, the method comprising:

precharging the first and second bit lines to a high voltage;
connecting one of the bit lines to the memory cell but not the other bit line;
receiving a signal to activate a read function;
receiving a control signal for selectively reading from the bit line connected to the memory cell;
if the memory cell has stored therein a low voltage, forcing the voltage of the bit line connected to the memory cell to a low reference voltage and forcing the voltage of the other bit line to a high reference voltage; and
if the memory cell has stored therein a high voltage, forcing the voltage of the bit line connected to the memory cell to the high reference voltage and forcing the voltage of the other bit line to the low reference voltage.

18. The method of claim 17 wherein the sense amplifier comprises:
first and second transistors respectively controlled by the first and second bit lines.

19. The method of claim 18 wherein forcing the voltage of the bit line connected to the memory cell to the high reference voltage and forcing the voltage of the other bit line to the low reference voltage comprises:
causing a greater current to flow through the transistor controlled by the bit line connected to the memory cell than through the transistor controlled by the other bit line.

* * * * *